(12) United States Patent
Pagani

(10) Patent No.: US 11,169,180 B2
(45) Date of Patent: Nov. 9, 2021

(54) METHOD FOR PRODUCING PROBES FOR TESTING INTEGRATED ELECTRONIC CIRCUITS

(71) Applicant: STMicroelectronics S.r.l., Agrate Brianza (IT)

(72) Inventor: Alberto Pagani, Nova Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 301 days.

(21) Appl. No.: 16/130,536

(22) Filed: Sep. 13, 2018

(65) Prior Publication Data

US 2019/0011484 A1 Jan. 10, 2019

Related U.S. Application Data

(62) Division of application No. 14/950,171, filed on Nov. 24, 2015, now Pat. No. 10,107,837, which is a division of application No. 13/106,615, filed on May 12, 2011, now Pat. No. 9,229,031.

(30) Foreign Application Priority Data

May 12, 2010 (IT) .......................... MI2010A000844

(51) Int. Cl.
*H05K 3/30* (2006.01)
*G01R 3/00* (2006.01)
*G01R 31/319* (2006.01)
*G01R 1/067* (2006.01)
*G01R 1/073* (2006.01)

(52) U.S. Cl.
CPC ............ *G01R 3/00* (2013.01); *G01R 1/06761* (2013.01); *G01R 1/07342* (2013.01); *G01R 31/31905* (2013.01); *G01R 1/07307* (2013.01); *Y10T 29/49002* (2015.01)

(58) Field of Classification Search
CPC ............ G01R 1/06761; G01R 1/07307; G01R 1/07342; G01R 3/00; G01R 31/31905
See application file for complete search history.

(56) References Cited

U.S. PATENT DOCUMENTS

| | | | |
|---|---|---|---|
| 5,378,971 A | 1/1995 | Yamashita | |
| 6,218,848 B1 | 4/2001 | Hembree et al. | |
| 6,294,908 B1 | 9/2001 | Belmore et al. | |
| 7,049,837 B2 | 5/2006 | Kasukabe et al. | |
| 7,112,974 B1 | 9/2006 | Jin et al. | |
| 7,931,611 B2 * | 4/2011 | Novak | A61B 17/54 604/22 |
| 7,987,595 B2 | 8/2011 | Lu | |
| 8,148,050 B2 * | 4/2012 | Jo | G01R 3/00 430/311 |

(Continued)

*Primary Examiner* — Paul D Kim
(74) *Attorney, Agent, or Firm* — Crowe & Dunlevy

(57) ABSTRACT

Cantilever probes are produced for use in a test apparatus of integrated electronic circuits. The probes are configured to contact corresponding terminals of the electronic circuits to be tested during a test operation. The probe bodies are formed of electrically conductive materials. On a lower portion of each probe body that, in use, is directed to the respective terminal to be contacted, an electrically conductive contact region is formed having a first hardness value equal to or greater than 300 HV; each contact region and the respective probe body form the corresponding probe.

25 Claims, 6 Drawing Sheets

(56) References Cited

U.S. PATENT DOCUMENTS

| | | |
|---|---|---|
| 8,353,912 B2 | 1/2013 | Darian et al. |
| 2005/0073057 A1 | 4/2005 | Tiziani et al. |
| 2008/0209719 A1 | 9/2008 | Lu |
| 2009/0128180 A1 | 5/2009 | Kim et al. |

* cited by examiner

METHOD FOR PRODUCING PROBES FOR TESTING INTEGRATED ELECTRONIC CIRCUITS

CROSS REFERENCE TO RELATED APPLICATION

This application is a divisional application from United States Application for patent Ser. No. 14/950,171 filed Nov. 24, 2015, now U.S. Pat. No. 10,107,837, which is a divisional application from U.S. application for patent Ser. No. 13/106,615 filed May 12, 2011 (now U.S. Pat. No. 9,229,031), which claims priority to Italian Patent Application No. MI2010A000844, filed May 12, 2010, the disclosures of which are incorporated herein by reference.

TECHNICAL FIELD

An embodiment generally relates to the electronic field. More specifically, an embodiment relates to the testing of integrated electronic circuits.

BACKGROUND

Electronic circuits are generally tested to verify their proper operation; this is of the utmost importance to ensure a high quality of the production process of the electronic circuits. The tests may be performed on each electronic circuit at different levels of the corresponding production process: for example, a test process called EWS (Electrical Wafer Sort) is performed on the electronic circuits included in a corresponding wafer of semiconductor material, before the individual portions of the wafer on which there are integrated the electronic circuits are diced into individual chips and embedded in respective packages. Such testing includes measurements performed on each electronic circuit by automatic test equipment (ATE). Such test apparatus is provided with a probe card, which substantially includes a printed circuit board comprising a plurality (typically, hundreds, or even thousands) of probes of conductive material for contacting corresponding conductive pads of the electronic circuits to be tested. During the test, the probe card is positioned in correspondence of a group of electronic circuits of the wafer so that the probes mechanically contact their pads (an operation that is called "probing"); this provides an electrical coupling between the test apparatus and the pads of such electronic circuits, which allows the test thereof. The same operations are repeated in succession on each group of electronic circuits of the wafer until all the electronic circuits formed therein have been tested.

In order to ensure that a proper probing procedure has been performed between each probe and the corresponding pad, typically before or after the test a (manual or automatic) checking operation is carried out, which consists of detecting and analyzing a probe mark left by the probe on the pad during the probing operation.

Being able to detect the presence and the arrangement of the probe marks allows first determining the correct alignment and centering between the probes of the probe card on the pads of the electronic circuits under test; in this way, it is possible to reconfigure the parameters of the probing so as to reduce the risk of damage of a passivation layer around the pad caused by a not totally accurate probing. Moreover, such risk is, in modern applications, very considerable, since the number of pads within a same electronic circuit is higher and higher, while the sizes of pads and their relative separation distances are smaller and smaller.

Moreover, the analysis of the probe mark allows for determining a correct and uniform pressure exerted by the probes of the probe card on the pads of the electronic circuits, so as to be able to act on the parameters of the probing in order to have a low and uniform contact resistance during the test.

However, in recent applications, the EWS test has drawbacks connected to the impracticality or impossibility of being able to perform such checking operation.

In fact, because of growing demands, especially in automotive applications, of electronic circuits capable of operating in adverse conditions (e.g., high temperatures), the pads (and the corresponding electric connections between the pads and respective terminals of the package) of such electronic circuits are more and more frequently formed by different materials with respect to those traditionally used (such as copper and aluminum). For example, United States Patent Application Publication No. 2005/0073057, which is incorporated by reference, proposes a multi-layer pad structure having a high hardness property; such property is achieved by using a conductive material with high hardness (e.g., nickel or alloys thereof), possibly covered by a thin protective layer of a relatively soft conductive material (e.g., palladium or alloys thereof).

The greater hardness of such pads with respect to the materials traditionally used for making the probes results in that, during the probing, the pad is not scratched by the respective probe; in this way, the probe mark is difficult to detect or not detectable, so that it turns out to be very difficult, if not practically impossible, to perform the checking operation of the probing. This involves a substantial impracticality or impossibility to act on parameters of the probing, with consequent increase during the test of the cases of breakage of the passivation layer, and loss of electric yield (due to a high and heterogeneous contact resistance between each probe of the probe card and the corresponding pad), which imply possible false test failures, and correspondingly a reduction in the process yield with consequent increase of the production costs of the electronic circuits.

Moreover, the use of traditional probes for performing the probing on the pads causes further drawbacks, concerning the uniformity of the mechanical effort exerted by the probe on the pad, the lifetime of the probe itself, and the simplicity of its production process.

At the same time, the impracticality to impossibility of leaving the probe mark may be due in part to the mechanical properties of the specific type of probe used for the test.

To that, there is added also the fact that at high temperatures the material of the probe may oxidize, thereby deteriorating the electrical performance thereof, and this, for example, disadvantages materials such as tungsten with respect to copper.

Recently, probes (of the MEMS and vertical type) have been developed and marketed having a hardness greater than that of the pads with high hardness, and that therefore may leave, during the probing operation, the probe mark on the pad of the integrated circuit to be tested; however, due to limited current conduction capability which MEMS and vertical probes are affected by, their use does not provide satisfactory results during the test of integrated circuits for applications requiring relatively high work currents for their correct operation.

For this reason, typically, for testing the integrated circuits requiring high currents, cantilever probes are used, which have better mechanical properties—for example, elasticity—and better electrical properties, since they have better current transport features with respect to MEMS and verticals probes.

Often for carrying high levels of current, probes are made of materials with high electrical conductivity, for example, using materials such as copper.

A particular type of cantilever probe is shown in United States Patent Application Publication No. 2008/0209719, which is incorporated by reference, and which includes a body of conductive material covered by materials apt to act as a coating for the probe (so as protect it from external contaminations); such probes can easily exhibit defects (such as, for example, coating cracks), which involve, during the probing, an uneven distribution of the mechanical stress exerted on the pad by the probe, which reflects, immediately, in a not optimal probing, and in the medium (or short) period, in the damage and possibly breakage of the probe itself (thereby requiring its replacement, which in turn involves the reconstruction of the whole probe card in which such probe is formed). The just mentioned drawbacks, as it is easily understandable, are exacerbated in the case that the pads of the electronic circuits to be tested have a high hardness.

Furthermore, the lapping operation of the probe tip (necessary for having an efficient coupling between it and the pad) causes the coating in correspondence of the tip to be removed, thus making necessary to perform a further coating process for restoring the coating eroded by it, which involves an evident complication of the manufacturing process with waste of time and ultimately costs increase.

SUMMARY

In view of the state of the art herein disclosed, an embodiment overcomes the above-mentioned drawbacks.

More specifically, an embodiment proposes a method for producing cantilever probes for use in test apparatus of integrated electronic circuits; the probes are configured to contact during the test corresponding terminals of the electronic circuits to be tested. The method comprises forming probe bodies of electrically conductive materials. In an embodiment, the method further includes forming on a lower portion of each probe body that, in use, is directed to the respective terminal to be contacted, an electrically conductive contact region having a first hardness value equal to or greater than 300 HV; each contact region and the respective probe body form the corresponding probe.

Another embodiment relates to a corresponding probe.

A further embodiment relates to a test apparatus including at least one such probe.

Thanks to an embodiment, even in particular applications, such as automotive applications, for which it may be necessary to produce electronic circuits having pads with high hardness, it may be possible to use cantilever probes ensuring both a great efficiency of the test phase (thanks to their high current capability) and the possibility of creating a probe mark on the pad (indicating the occurred contact between the probe and the pad during the execution of the functional and/or parametric electrical test). Therefore, it may be possible to use to the same detection and analysis techniques of the probe mark that typically are used downstream of the test of standards for electronic circuits (i.e., having traditional pads) performed through traditional probes. Therefore, an embodiment implies a considerable reduction of the production costs, since the yield losses resulting from both damaging of the circuits (caused by the impracticality or impossibility of controlling the probe mark for acting accordingly on the parameters of the probing process) and from unreliable test results (caused by insufficient currents and/or imprecise alignments between probes and respective pads).

Moreover, a proposed embodiment for making such probes includes few additional phases with respect to the known processes, and which substantially do not cause any inconvenience that may preclude an efficient and uniform action of the probe on the pad of the electronic circuit during the probing. This allows obtaining probes that act effectively on the pads during the probing, and that are able to withstand prolonged and intensive periods of use without incurring frequent damages, and thus without having to provide for their repeated replacement.

BRIEF DESCRIPTION OF THE DRAWINGS

Features and advantages of one or more embodiments will be best understood with reference to the following detailed description, given purely by way of a non-restrictive indication, to be read in conjunction with the accompanying drawings (wherein corresponding elements are denoted with equal or similar references, and their explanation is not repeated for the sake of exposition brevity). In this respect, it is expressly understood that the figures are not necessarily drawn to scale and that, unless otherwise indicated, they are simply used to conceptually illustrate the described structures and procedures. In particular.

DETAILED DESCRIPTION

Figure 1:
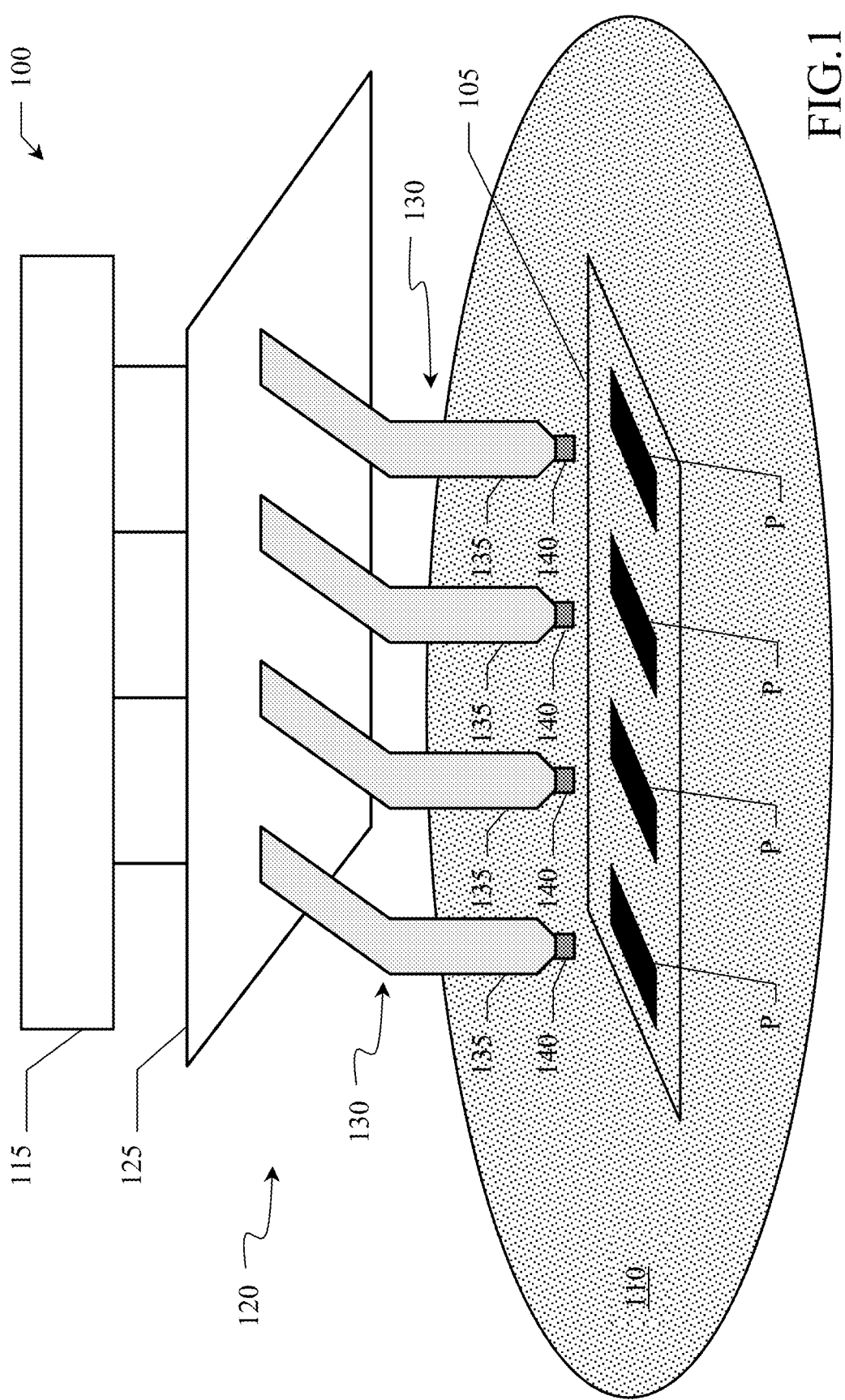
FIG. 1 shows a test apparatus in which an embodiment may be used.

With particular reference to FIG. 1, there is schematically shown a test apparatus 100 according to an embodiment. The test apparatus 100 is used for performing an electrical functional and/or parametric test on electronic circuits 105 (only one shown in the figure) integrated in a wafer of semiconductor material 110, which are then divided by a cutting operation; each electronic circuit 105 includes electrically conductive terminals (or pads) P so as to allow a transmission of electric signals from/to functional components (not shown in the figure) of the electronic circuit 105. The test apparatus 100 includes a test driver 115 for transmitting test signals to the electronic circuits 105 and receiving response signals indicative of a state of such electronic circuits 105 and/or of a result of their test. To such purpose, the test driver 115 is electrically coupled to a probe card 120 including a printed circuit board (or PCB) 125 and a plurality of probes 130 (only four shown in the figure, purely by way of example only) each one to be coupled to a corresponding pad P of the electronic circuit 105. The test driver 115 may be part of the ATE (not shown in the figure)

or be coupled thereto. For mechanically coupling the wafer 110 to the probe card 120, so as to test the corresponding integrated circuits 105, a suitable apparatus may be used for example, which may be called a prober (not shown in the figure), which includes within it both a support (called "chuck") on which the wafer is placed 110, and the probe card 120. In such way, the pads P of the electronic circuits 105 to be tested are contacted to corresponding probes 130 of the probe card 120, and hence to the test driver 115.

In the particular described scenario, each pad P is formed by one or more conductive layers (not shown in the figure for simplicity) of materials such as to give to the pad P a hardness totally greater than that of a traditional pad. For example, a traditional pad, typically formed by a conductive copper layer and by a conductive aluminum layer placed on it, has hardness values between approximately 15 HV and 150 HV (according to Vickers scale), depending on the relative thickness of the conductive layers forming such pad. The pad P at issue, however, includes, for example, a conductive layer of material having hardness greater than approximately 350 HV—such as nickel (or an alloy thereof), which may have hardness values between approximately 350 HV and 750 HV (and up to approximately 1100 HV after specific thermal treatments), and a conductive layer of material having relatively low hardness (for example, lower than approximately 350 HV, such as in the case of palladium or alloys thereof); depending on the relative thickness of such conductive layers, the total hardness value of the pad P will have a value equal or greater than approximately 300 HV (so that the corresponding electronic circuit may be used in particular applications—such as for example automotive applications)

Turning back to FIG. 1, each probe 130 includes a known cantilever probe body 135; in an embodiment, the probe 130 is such that a lower portion of the probe body 135 (i.e., the portion of the probe body 135 facing the pad P of the electronic circuit 105 during the probing), is covered by a contact layer 140 of an electrically conductive material having a hardness value greater than that of the pad to be contacted. For example, the probe body 135 may be formed of copper-beryllium, tungsten, or tungsten-rhenium, which have hardness values between approximately 280 and 380 HV, 660 and 740 HV, 740 and 880 HV, respectively. The contact portion 140 may be formed, for example, of composite materials including a set or subset of the following materials: nickel, manganese, palladium, cobalt, rhodium, iron, molybdenum, iridium, ruthenium, tungsten, rhenium and/or combinations thereof or their alloys in combination with other materials, and, depending on the particular implementations, hardness values substantially between approximately 300 and 1500 HV or even higher may be obtained. In this way, the probe 130, while having a probe body 135 made of a conventional conductive material, thanks to the provision of the contact layer 140, is able, during the probing, to leave a probe mark even on pads P having such hardness that they may not be scratched by traditional probes, such as for example the pads made in some integrated circuits for nowadays automotive applications.

The material of the contact layer 140 may be chosen based on economic and logistics considerations, as well as based on the actual hardness value of the pads of the electronic circuits of the production line and on the specific type of probe used; in fact, using cantilever probes, as in the described embodiment, the hardness value of the contact layer 140 may also be approximately equal, or slightly lower, with respect to the hardness of the pad P; this is because, due to the intrinsic shape and elasticity of the cantilever probe, the force exerted on the surface of the pad P by the probe tip has both a vertical component, which determines the depth of the probe mark, and a horizontal component, which, by sliding the probe tip on the pad, determines the length of the probe mark left on the pad P.

Figure 2A:
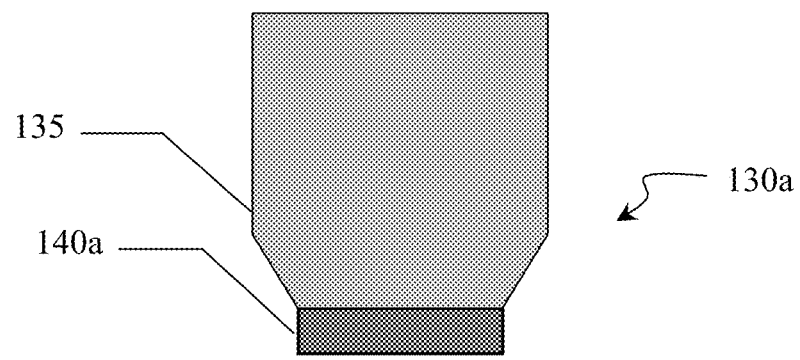
FIGS. 2A-2C schematically show a detail of FIG. 1 according to corresponding embodiments.

Turning to FIG. 2A, there is schematically shown a generic probe 130a of the test apparatus of FIG. 1 according to an embodiment; the probe 130a includes the probe body 135 and a contact layer 140a having flat faces and generally rectangular section able to provide a good adhesion, and correspondingly a good electrical continuity with a high current carrying capability, with the pad to be contacted (not shown).

Figure 2B:
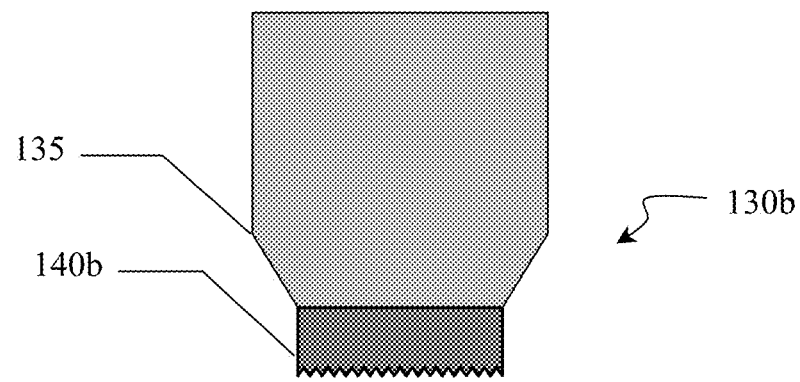

In order to improve the abrasive properties of the probe so as to leave a probe mark on the pad that is easily distinguishable and detectable in a particularly effective way, in an embodiment it is possible to use the probe 130b shown in FIG. 2B; in this case, the contact layer 140b of the probe 130b includes, as in the case of the above described contact layer 140a, a flat top face (to be coupled efficiently to the probe body 135) and a bottom face wrinkled (e.g., knurled) so as to form, during the probing, a probe mark easily detectable even in case of slight pressure of the probe 130b on the pad.

Figure 2C:
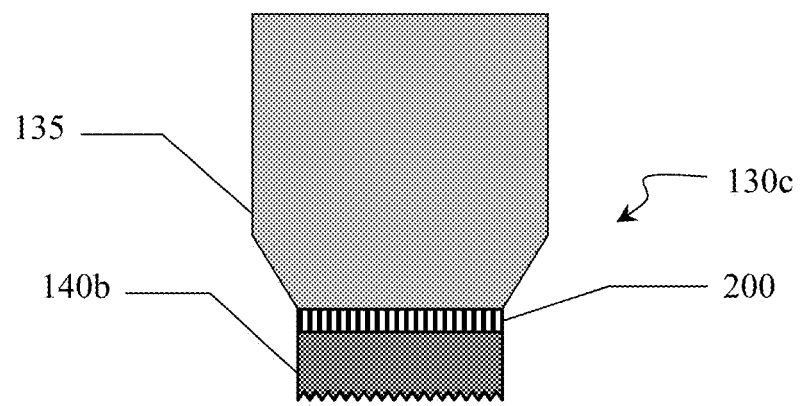

In another embodiment, shown in FIG. 2C, the probe 130c includes an interface or support layer 200, which, formed between the contact layer 140b and the probe body 135 according to a known technique, provides a precise adherence, this allowing to obtain an efficient electrical continuity between the probe body 135 and the pad of the electronic circuit to be tested. Of course, the type of material used for the making of the supporting layer may not be definable a priori, as it may heavily depend on physical, chemical, and mechanical properties of the materials used for the probe body 135 and the contact layer 140.

Please note that the embodiments described above for the probes 130 should not be construed in a limitative way, but rather they should be considered only exemplary of the fact that it is possible to implement an embodiment in a great number of variants. In the following, for reasons of completeness and at the same time of simplicity and uniformity of exposure, explicit reference will be made only to the probe 130c (shown in FIG. 2C); such choice is not to be understood however in a limitative way, since aspects related to the probes 130a and 130b (such as their production process) may be easily inferred, for similarities and/or differences from corresponding aspects shown only for the probe 130c.

Figure 3A:
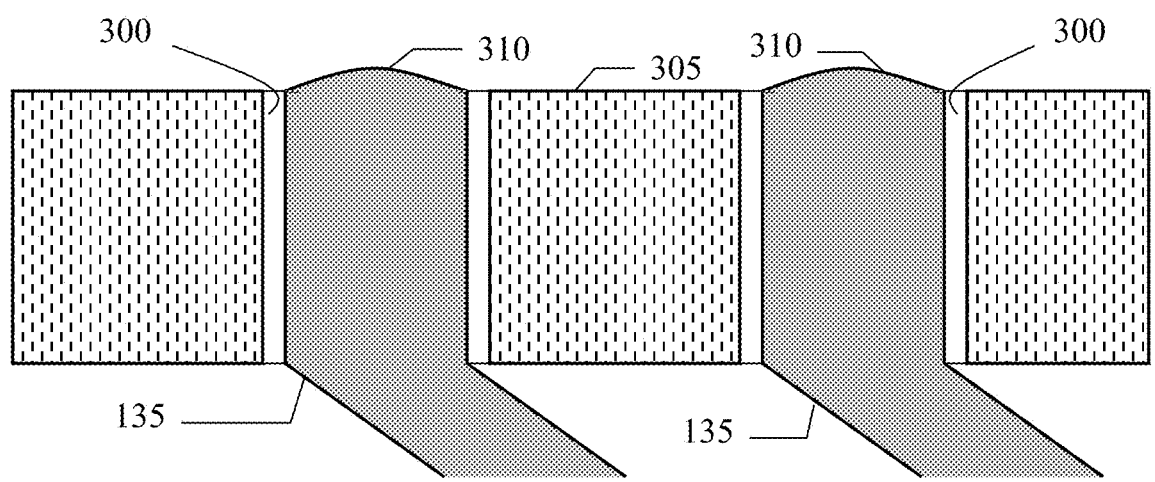
FIGS. 3A-3C schematically show some phases of a production process of the probe of FIG. 2C according to an embodiment.
Figure 3B:
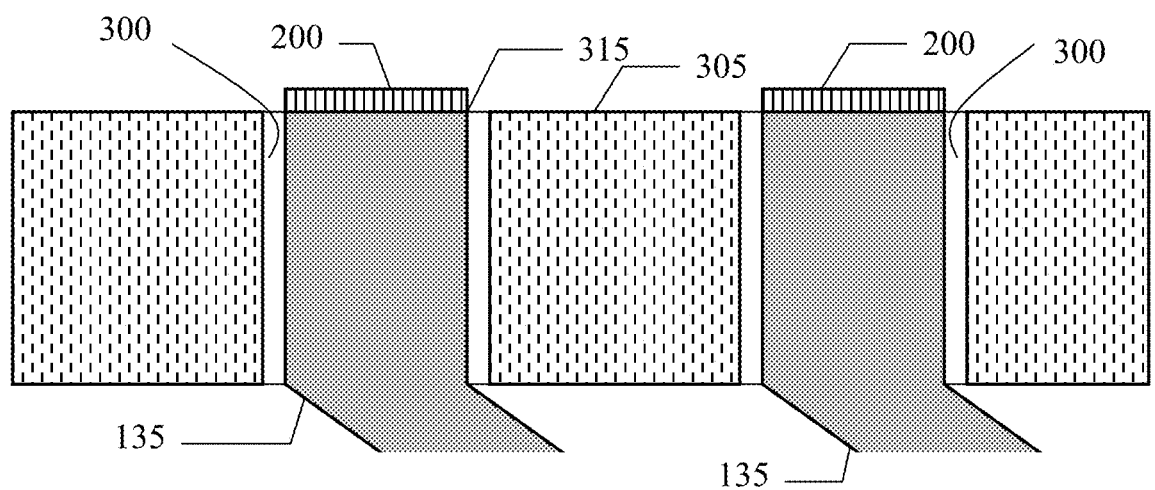
Figure 3C:
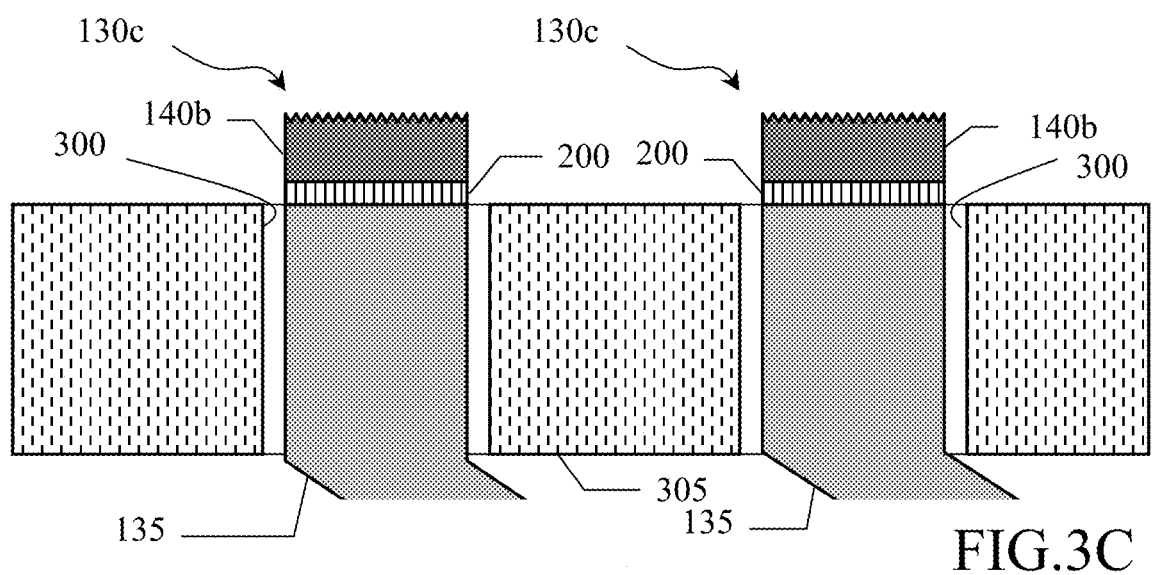

FIGS. 3A-3C schematically show some phases of a production process of the probe 130c according to an embodiment; for reasons of simplicity and brevity of exposition, such production process will be described only in the subsequent phases of the production process (the earlier phases may be conventional) of the probe card and of the probe body 135. As visible in FIG. 3A, each probe body 135 is inserted into a corresponding hole 300 of a cover support 305 of the probe body 135, for example of ceramic or polymeric material, so that each probe body 135 has a lower portion 310 thereof projecting from the respective hole 300; in this way, the portions protruding from the holes may be subjected to the process phases provided to form the probe tip (as will be explained shortly) without involving the probe body 135.

As schematically shown in FIG. 3B, the protruding portion 310 of each probe body 135 is subjected to a known planarization or lapping process, so as to form a corresponding active region 315 (on which the probe tip will be formed)

being flat and having reduced surface roughness. Then, the support layer 200 is deposited on the active region 315 of the probe body 135 according to a known deposition procedure, such as for example: chemical vapor deposition (CVD), physical vapor deposition (PVD), thermal spray coating, (TSC), electrochemical plating (EP), or electroless plating, (ElsP).

As schematically shown in FIG. 3C, the contact layer 140b is formed on such support layer 200 by a known technique, which contact layer is obtained from a layer of material with high hardness that is possibly processed so as to make its contact surface (i.e., the one that will contact the pad during the probing operation) wrinkled/milled.

At this point, the cover support 305 may be removed, and the probes 130c thereby obtained may be used in the test apparatus as previously described.

Figure 4A:
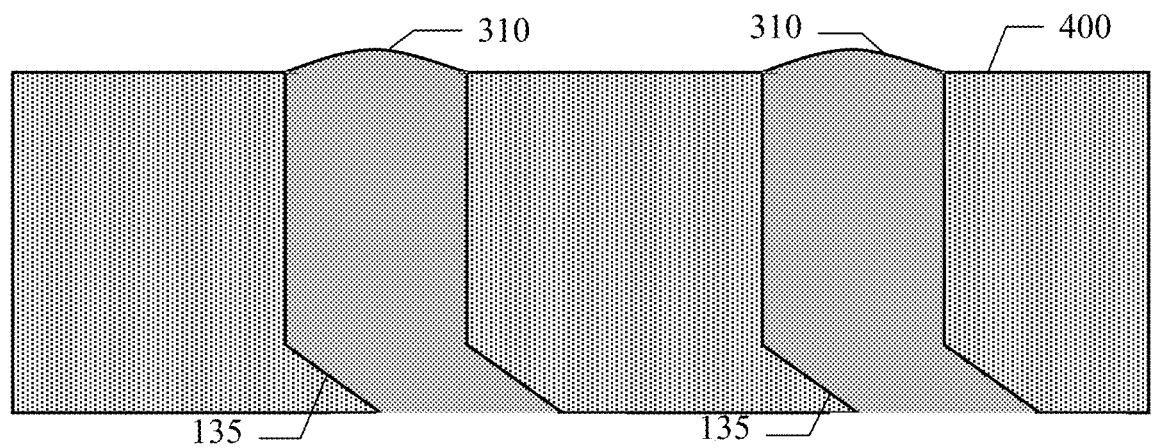
FIGS. 4A-4C schematically show some phases of a production process of the probe of FIG. 2C according to another embodiment.
Figure 4B:
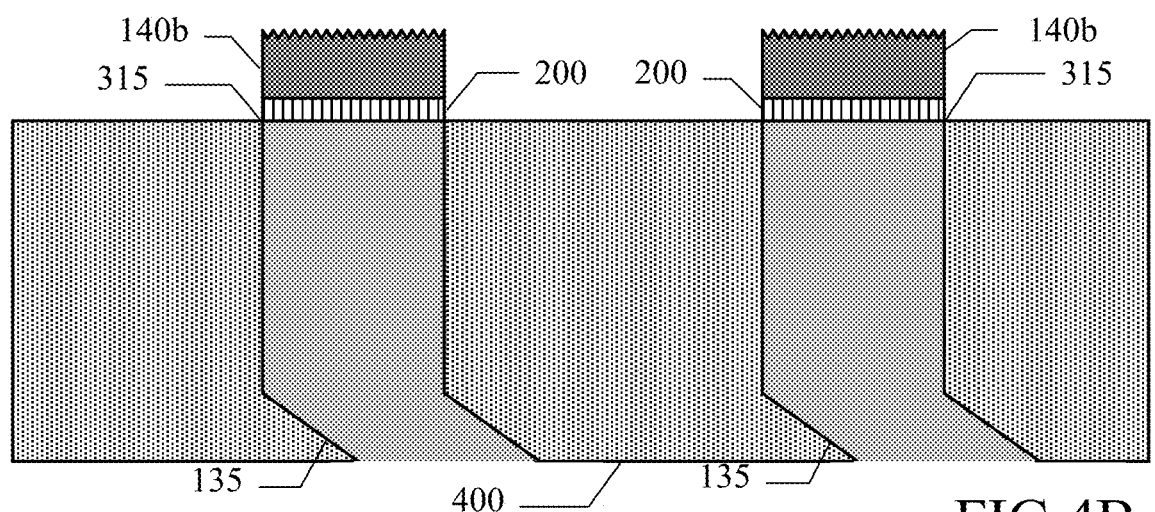
Figure 4C:
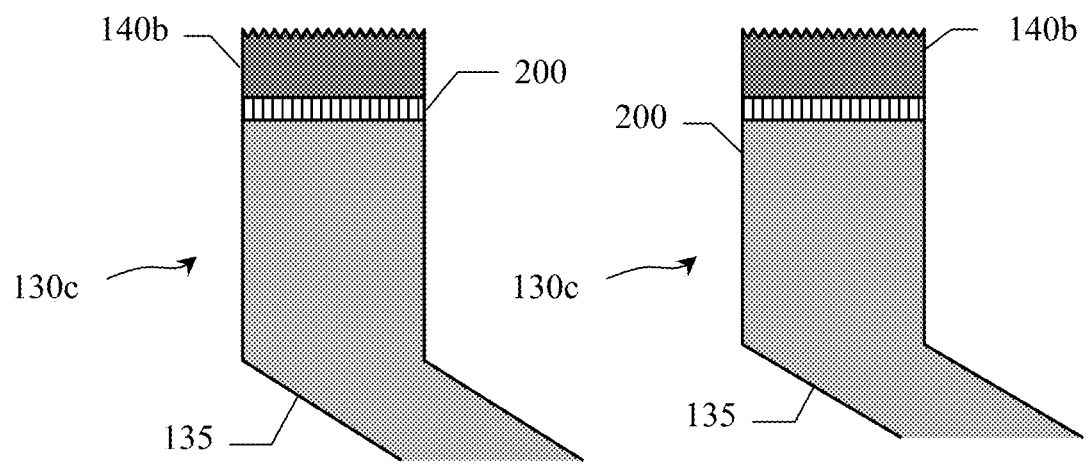

A different embodiment with respect to the just described production method of the probes is shown in FIG. 4A-4C; as schematized in FIG. 4A, each probe body 135 is completely wrapped (apart from the protruding portion 310 at the end of the probe body 135, on which the contact portion—i.e., the probe tip—will be formed) by a casing 400 formed from a material (e.g., polymer or resin) applied through a known technique (e.g., immersion or deposition); such casing 400, unlike the cover support (that needs holes through which to introduce the probe bodies 135), adheres on each probe body 135 without leaving gaps between a probe body 135 and an adjacent one.

Turning to FIG. 4B, analogously to that previously described, there is the deposition of the support layer 200 on the active region 315 and then of the contact layer 140b on the support layer 200.

Subsequently, the casing 400 is removed, for example, through a chemically selective etching process, so that the resulting probes 130c shown in FIG. 4C may be used for the running of the test, for example, introduced in the apparatus of FIG. 1.

Figure 5A:
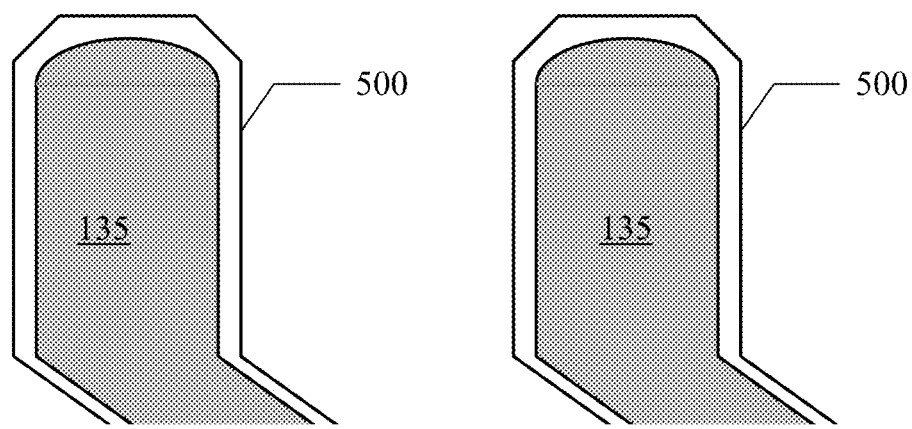
FIGS. 5A-5C schematically show some phases of a production process of the probe of FIG. 2C according to a further embodiment.

In an alternative embodiment of the production process of the probes (shown in the FIGS. 5A-5C), each probe body 135 is completely covered (including the active end of the probe body 135) by a thin protective layer 500, as visible in FIG. 5A, of a suitable material, as will be explained shortly.

Figure 5B:
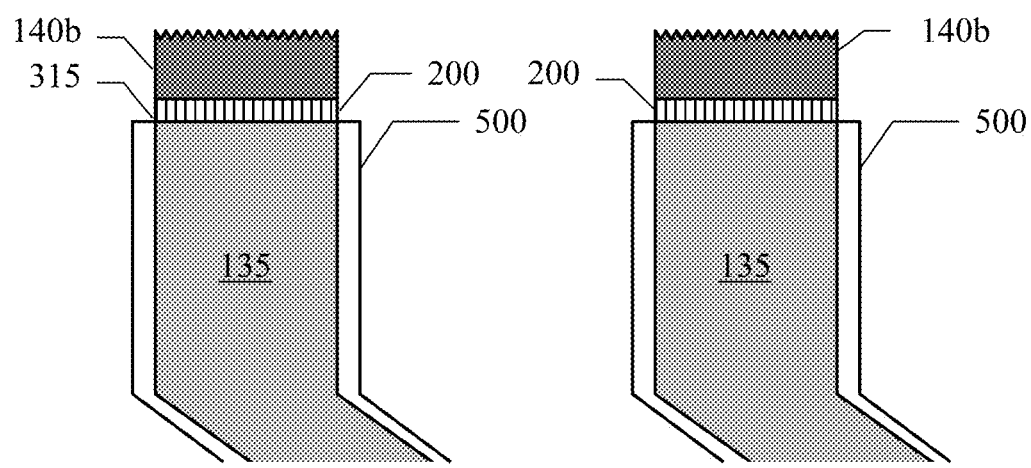
Figure 5C:
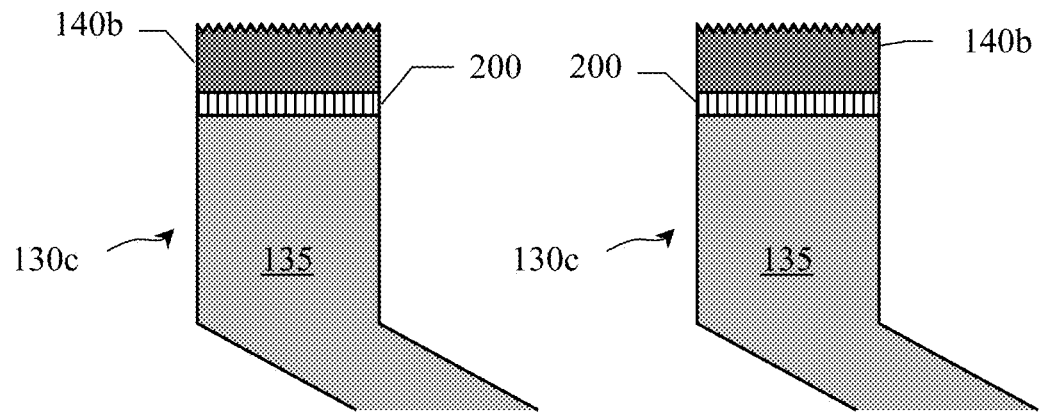

In FIG. 5B there is shown the probe 130c after the planarization process and subsequent lapping of the end of the probe body 135 to form the corresponding active region 315, and the deposition on the latter of the support layer 200 and the contact layer 140b. The material of the protective layer 500 is such that it prevents adhesion to both the support layer 200 and to the contact layer 140b; then, once the protective layer 500 has been removed, e.g., by selective etching, the tip of the probe 130c thereby obtained is properly formed and aligned with the planarized active region of the probe body 135, as visible in FIG. 5C.

Figure 6A:
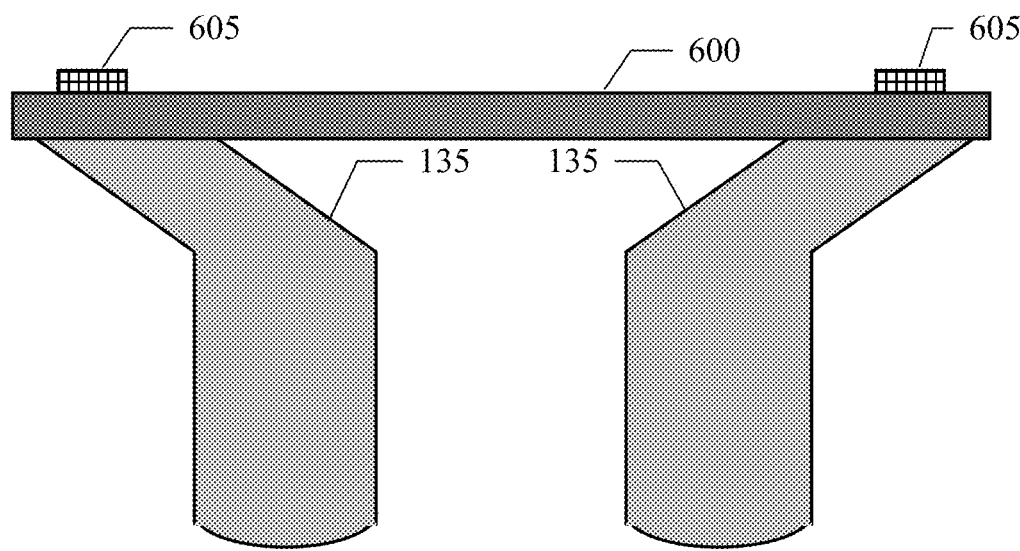
FIGS. 6A and 6B schematically show a particular of the test apparatus of FIG. 1 according to an embodiment, before and after the forming of the probes, respectively.
Figure 6B:
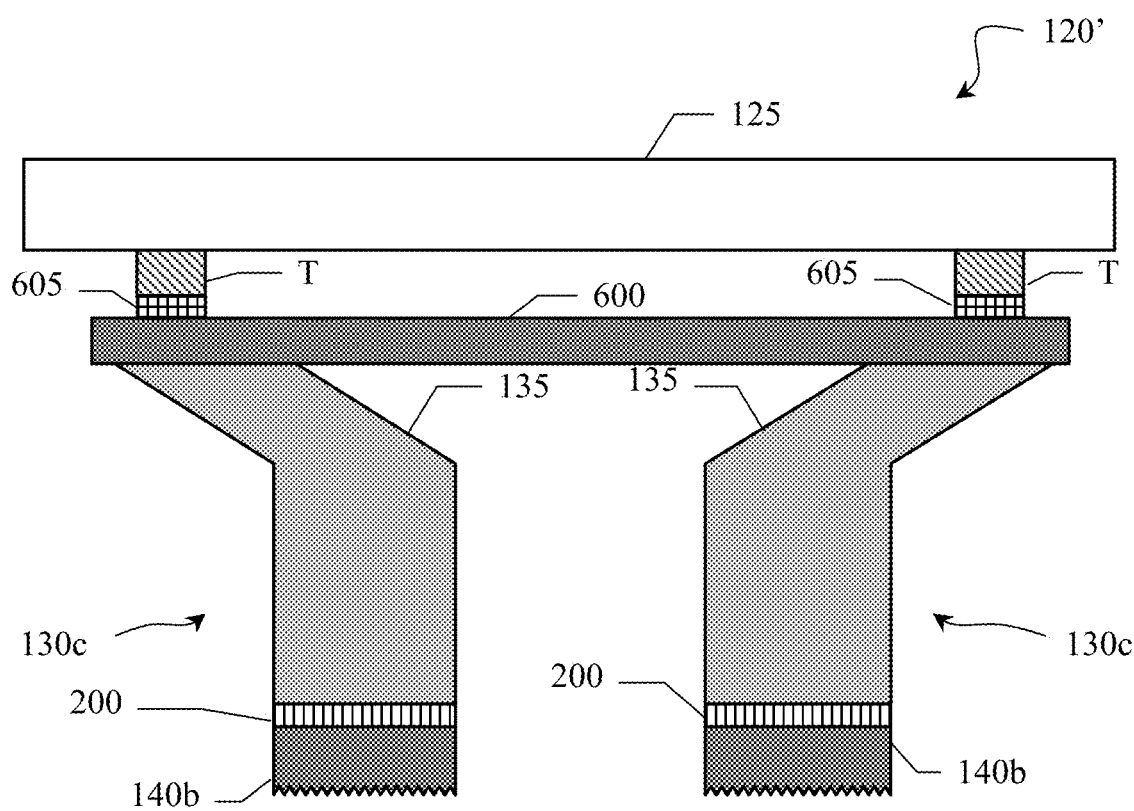

Apart from which one of the previous embodiments may be implemented for the production of the probes, some of the above-mentioned phases may include process operations that require properly biasing the probes. In this regard, as shown in FIG. 6A, each probe body 135 may be coupled to a support 600 (e.g., a PCB or a ceramic material) configured for biasing, through connectors 605 (only two shown in the figure), the probe bodies 135, so as to facilitate the following processing phases thereof leading to the making of the respective probes. Once the probes, e.g., the probes 130c, have been obtained through one of the above described processes (or other equivalent or similar proceedings) the probe-support assembly may be coupled, through the same connectors 605, to conductive terminals T of the printed circuit board 125, thereby obtaining a probe card 120' as shown in FIG. 6B.

An embodiment may be advantageous since it allows using, even in electronic circuits (such as those intended to automotive applications) having pads P with high hardness, the same techniques of detection and analysis of the probe mark normally used for electronic circuits with traditional pads, and, at the same time, testing (thanks to the electrical properties of the cantilever probes) electronic circuits that require high working currents; in this way, it may be possible to optimally adjust the probing operation of the probe 130 on the pad P so as to avoid waste, defects and/or breakage during the production of the electronic circuits, and also reduce the number of false test results caused by insufficient testing current (supplied by the probes). Furthermore, an embodiment of the production process is extremely simple and requires no additional processing phases particularly onerous with respect to a production process commonly used in the current technologies. The cantilever probes obtained through an embodiment of such a production process also provides a good efficiency and uniformity of pressure exerted on the respective pad during the probing procedure, thus resulting in a particularly extended useful lifetime of the probes.

In an embodiment, the provision of the support 600, moreover, may also allow a rapid and efficient replacement of the probes when necessary. This allows obtaining an optimized test apparatus both in performance and in intervention times on its components.

Naturally, in order to satisfy local and specific requirements, one may apply to one or more of the embodiments described above many logical and/or physical modifications and alterations. More specifically, although one or more embodiments have been described with a certain degree of particularity, it should be understood that various omissions, substitutions and changes in the form and details as well as other embodiments are possible. In particular, different embodiments may even be practiced without the specific details (such as the numeric examples) set forth in the preceding description for providing a more thorough understanding thereof; on the contrary, well known features may have been omitted or simplified in order not to obscure the description with unnecessary particulars. Moreover, it is expressly intended that specific elements and/or method phases described in connection with any disclosed embodiment may be incorporated in any other embodiment as a matter of general design choice.

For example, the above-described embodiment of a method is merely illustrative and no way limitative. For example, an embodiment may be implemented with equivalent processes (by using similar phases, removing some phases not essential, or adding further optional phases); moreover, the phases may be performed in different order, concurrently or in an interleaved way (at least partly). For example, the number of conductive layers forming the contact portion 140 is not limitative, as well as the absolute hardness value thereof; in fact, the combination of parameters such as type of material of each layer and the relative thickness with respect to the other layers forming the contact portion 140 may determine the physical and mechanical characteristics, such as hardness, of the contact portion. For this reason, the support layer 200, provided that properly sized, may have a low hardness with respect to the overall hardness of the contact portion 140.

The type of materials, as well as the number and thickness thereof, that may be used to form the protective coating of the probe body for preventing the damaging thereof during the forming of the probe tip may be different and no way limitative; their choice, in fact, may be based on contingent design specifications.

Also the probe body 135 may be formed of material with high hardness, for example, for providing an increased pressure on the pad P to be contacted during the probing.

The type of probe is not limitative. The structure of the contact portion 140 and/or the composition thereof may also depend on the type of probe used, and, therefore, the embodiments described in the present document should not be construed as limiting. For example, other types of probes may be used, depending on the wanted size thereof in relation to their capability of carrying the required current.

The test apparatus 100 is not limitative; other test apparatus may be associated with an embodiment of a probe. For example, the same considerations apply if the test apparatus 100 has a different structure or includes equivalent components, either separated from each other or combined together, in whole or in part). In particular, the test apparatus 100 may include systems (software, hardware such as a processor or controller, or a combination thereof) for controlling, analyzing, and adjusting the probing.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A method, comprising:
    inserting a probe body made of an electrically conductive material to pass through an opening of a support, wherein the probe body in inserted into the opening at the back side of the support and an end of the probe body is exposed from said opening at the front side of the support;
    polishing the exposed end of the probe body at the front side of the support; and
    depositing an electrically conductive contact region having a first hardness value equal to or greater than 300 HV to the polished exposed end of the probe body.

2. The method of claim 1, wherein depositing comprises forming a conductive layer directly on said polished exposed end of the probe body.

3. The method of claim 2, wherein said conductive layer is formed by a conductive layer made of a material selected from the group consisting of nickel, manganese, palladium, cobalt, rhodium, iron, molybdenum, iridium, ruthenium, tungsten, rhenium and alloys thereof.

4. The method of claim 1, wherein depositing comprises:
    forming at least one support conductive layer directly on said polished exposed end of the probe body; and
    forming a conductive layer directly on said at least one support conductive layer.

5. The method of claim 4, wherein said conductive layer is formed by a conductive layer made of a material selected from the group consisting of nickel, manganese, palladium, cobalt, rhodium, iron, molybdenum, iridium, ruthenium, tungsten, rhenium and alloys thereof.

6. The method of claim 4, wherein forming at least one support conductive layer comprises performing a chemical vapor deposition of conductive material on the polished exposed end.

7. The method of claim 4, wherein forming at least one support conductive layer comprises performing a physical vapor deposition of conductive material on the polished exposed end.

8. The method of claim 4, wherein forming at least one support conductive layer comprises performing a thermal spray coating of conductive material on the polished exposed end.

9. The method of claim 4, wherein forming at least one support conductive layer comprises performing an electrochemical plating of conductive material on the polished exposed end.

10. The method of claim 4, wherein forming at least one support conductive layer comprises performing an electroless plating of conductive material on the polished exposed end.

11. The method of claim 1, further comprising knurling an end surface of the electrically conductive contact region.

12. The method of claim 1, wherein the support has a surface, and wherein inserting the probe body comprises exposing the end of the probe body beyond said surface and wherein polishing the exposed end of the probe body comprises polishing so that the polished exposed end is coplanar with said surface.

13. The method of claim 1, wherein the support is made of a ceramic material.

14. The method of claim 1, wherein the support is made of a polymeric material.

15. The method of claim 1, further comprising removing the support to obtain a probe comprising said probe body with the electrically conductive contact region.

16. A method, comprising:
    providing a support having an opening extending completely through said support from a back side to a front side;
    providing a cantilever probe comprising a body having a bend and a probe end portion extending from said bend;
    inserting probe end portion into said opening from the back side such that a protruding part of the probe end portion protrudes from the front side of the support;
    polishing the protruding part of the probe end portion to form a polished exposed end;
    depositing an electrically conductive contact region having a first hardness value equal to or greater than 300 HV at a polished exposed end; and
    removing the probe end portion of the cantilever probe from the opening in the support.

17. The method of claim 16, wherein depositing comprises forming a conductive layer directly on said polished exposed end.

18. The method of claim 17, wherein said conductive layer is formed by a conductive layer made of a material selected from the group consisting of nickel, manganese, palladium, cobalt, rhodium, iron, molybdenum, iridium, ruthenium, tungsten, rhenium and alloys thereof.

19. The method of claim 16, wherein depositing comprises:
    forming at least one support conductive layer directly on said polished exposed end; and
    forming a conductive layer directly on said at least one support conductive layer.

20. The method of claim 19, wherein said conductive layer is formed by a conductive layer made of a material selected from the group consisting of nickel, manganese, palladium, cobalt, rhodium, iron, molybdenum, iridium, ruthenium, tungsten, rhenium and alloys thereof.

21. The method of claim 19, wherein forming at least one support conductive layer comprises performing one of: a chemical vapor deposition of conductive material on the polished exposed end; a physical vapor deposition of conductive material on the polished exposed end; a thermal spray coating of conductive material on the polished exposed end; an electrochemical plating of conductive material on the polished exposed end; or an electroless plating of conductive material on the polished exposed end.

22. The method of claim 16, further comprising knurling an end surface of the electrically conductive contact region.

23. The method of claim 16, wherein polishing the protruding part of the probe end portion polishing so that the polished exposed end is coplanar with the front side.

24. The method of claim 16, wherein the support is made of a material selected from the group consisting of a ceramic material and a polymeric material.

25. The method of claim 16, wherein the body of the cantilever probe is made of a material selected from the group consisting of: copper-beryllium, tungsten, and tungsten-rhenium.

\* \* \* \* \*